(12) United States Patent
Han (10) Patent No.: US 11,980,085 B2
(45) Date of Patent: *May 7, 2024

(54) DISPLAY DEVICE AND METHOD OF INSPECTING THE SAME

(71) Applicant: Samsung Display Co., Ltd., Yongin-si (KR)

(72) Inventor: Ho Seok Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 57 days.

This patent is subject to a terminal disclaimer.

(21) Appl. No.: 17/378,599

(22) Filed: Jul. 16, 2021

(65) Prior Publication Data

US 2021/0343945 A1 Nov. 4, 2021

Related U.S. Application Data

(63) Continuation of application No. 16/509,246, filed on Jul. 11, 2019, now Pat. No. 11,069,857, which is a (Continued)

(30) Foreign Application Priority Data

Nov. 11, 2016 (KR) .................. 10-2016-0150206

(51) Int. Cl.
*G09G 3/3225* (2016.01)
*G06F 3/038* (2013.01)
(Continued)

(52) U.S. Cl.
CPC ............. *H10K 71/70* (2023.02); *G06F 3/038* (2013.01); *G09G 3/006* (2013.01); *G09G 3/20* (2013.01);
(Continued)

(58) Field of Classification Search
CPC ...... G01F 2/9505; G02F 2001/136254; G09G 3/006; G09G 2320/043–048;
(Continued)

(56) References Cited

U.S. PATENT DOCUMENTS 8,217,924 B2 7/2012 Kwak et al.
8,497,695 B2 7/2013 Matoba et al.
(Continued)

FOREIGN PATENT DOCUMENTS

KR 10-0947178 3/2010
KR 10-2014-0015887 2/2014
(Continued)

OTHER PUBLICATIONS

MIPI Demonstrates Momentum in 2016, MIPI Alliance.

*Primary Examiner* — Eric A. Ward
(74) *Attorney, Agent, or Firm* — Lewis Roca Rothgerber Christie LLP (57) ABSTRACT

A display device includes a sensing line and a data driver. The sensing line is in a display panel. The data driver includes a plurality of integrated circuits. Each of the integrated circuits includes an interface, which includes a mobile industry processor interface (MIPI) and a crack detector. The crack detector detects cracks of the panel based on the sensing line and transmits and receives information corresponding to the crack to and from adjacent ones of the integrated circuits using a transmission terminal and a reception terminal in the MIPI.

20 Claims, 4 Drawing Sheets

Related U.S. Application Data continuation of application No. 15/785,996, filed on Oct. 17, 2017, now Pat. No. 10,355,211.

(51) Int. Cl.
    *G09G 3/00* (2006.01)
    *G09G 3/20* (2006.01)
    *H01L 21/66* (2006.01)
    *H01L 27/12* (2006.01)
    *H10K 59/131* (2023.01)
    *H10K 71/00* (2023.01)
    *H10K 71/70* (2023.01)

(52) U.S. Cl.
    CPC ........... *G09G 3/3225* (2013.01); *H01L 22/14* (2013.01); *H01L 22/34* (2013.01); *H01L 27/1259* (2013.01); *H10K 59/131* (2023.02); *H10K 71/00* (2023.02); *G09G 2300/0426* (2013.01); *G09G 2310/0275* (2013.01); *G09G 2330/045* (2013.01); *G09G 2330/12* (2013.01)

(58) Field of Classification Search
    CPC ......... G09G 2330/04; G09G 2330/045; G09G 2330/08; G09G 2330/12; G09G 2380/02; G01N 21/9501; G01N 21/9503; H01L 22/00–34; H01L 27/3276; H01L 27/3279; H01L 27/3297; H01L 51/0031; H01L 51/0097; H01L 2251/5338
See application file for complete search history.

(56) References Cited

U.S. PATENT DOCUMENTS

| | | |
|---|---|---|
| 9,437,154 B2 | 9/2016 | Nakata et al. |
| 9,489,065 B2 | 11/2016 | Bae |
| 9,983,452 B2 | 5/2018 | Jia et al. |
| 11,069,857 B2 * | 7/2021 | Han ................... G06F 3/038 |
| 2011/0175800 A1 * | 7/2011 | Mizumaki .......... G09G 3/006 |
| | | 345/87 |
| 2013/0044088 A1 | 2/2013 | Chang-Chian et al. |
| 2014/0028650 A1 | 1/2014 | Bae |
| 2014/0078133 A1 * | 3/2014 | Lee ..................... G09G 5/00 |
| | | 345/213 |
| 2014/0167769 A1 * | 6/2014 | Kim ................... G09G 3/3208 |
| | | 324/414 |
| 2014/0176524 A1 | 6/2014 | Lee et al. |
| 2016/0043010 A1 | 2/2016 | Kwak et al. |
| 2016/0232011 A1 | 8/2016 | Lin et al. |
| 2016/0351093 A1 | 12/2016 | Kim et al. |
| 2016/0358527 A1 | 12/2016 | Bae et al. |
| 2017/0199439 A1 | 7/2017 | Jia et al. |
| 2017/0309530 A1 | 10/2017 | Ilkov |
| 2018/0053455 A1 | 2/2018 | Zhang et al. |

FOREIGN PATENT DOCUMENTS

| | | |
|---|---|---|
| KR | 10-2015-0084564 A | 7/2015 |
| KR | 10-2016-0017845 | 2/2016 |

\* cited by examiner

DISPLAY DEVICE AND METHOD OF INSPECTING THE SAME

CROSS-REFERENCE TO RELATED APPLICATIONS

This application is a continuation of U.S. patent application Ser. No. 16/509,246, filed Jul. 11, 2019, which is a continuation of U.S. patent application Ser. No. 15/785,996, filed Oct. 17, 2017, now U.S. Pat. No. 10,355,211, which claims priority to and the benefit of Korean Patent Application No. 10-2016-0150206, filed Nov. 11, 2016, the entire contents of all of which are incorporated herein by reference.

BACKGROUND

1. Field

One or more embodiments described herein relate to a display device and a method for inspecting a display device.

2. Description of the Related Art

A variety of displays have been developed. Examples include liquid crystal displays and organic light emitting displays. In manufacturing these and other displays, multiple panels are formed on one mother substrate. The substrate is then scribed and divided into separate panels. When the substrate is divided (e.g., cut), cracks may form in the panels. Cracks may also occur as the result of various environmental influences. When an overcurrent is supplied to a panel having a crack, a fire may occur.

During manufacturing, an inspection may be performed to locate cracks in a panel. Also, when the panel uses multiple integrated circuits, a method for resetting the integrated circuits in accordance with a detected crack may be performed.

SUMMARY

In accordance with one or more embodiments, a display device includes a sensing line in a panel; and a data driver including a plurality of integrated circuits, each of the integrated circuits including an interface which includes: a mobile industry processor interface (MIPI) connected to an external system; and a crack detector to detect a crack of the panel based on the sensing line and to transmit and receive information corresponding to the crack to and from adjacent ones of the integrated circuits using a transmission terminal and a reception terminal in the MIPI.

The sensing line may include a first side connected to a first integrated circuit among the integrated circuits and a second side connected to a second integrated circuit among the integrated circuits.

The crack detector may include a voltage supplier/receiver to supply or receive a voltage to or from the sensing line; a voltage detector to determine whether the voltage from the voltage supplier/receiver is a normal voltage; and reset logic connected to the voltage detector to transmit and receive at least one of an error signal or a reset signal using the transmission terminal and the reception terminal. The error signal may be indicative of the crack of the panel. The reset signal may correspond to an off state of the first and second integrated circuits.

The error signal may be sequentially supplied to the second integrated circuit through the first integrated circuit. The reset signal may be sequentially supplied to the first integrated circuit through the second integrated circuit. The reset signal may set the first and second integrated circuits in off states. When a level of the voltage is lower than a predetermined level, the voltage detector may determine that the voltage is an abnormal voltage and is to supply a detection signal to the reset logic. The reset logic may supply the error signal to an adjacent one of the integrated circuits.

Each of the integrated circuits may include a voltage source to output a driving power source; a data processor to rearrange data items supplied via the interface and to store the rearranged data items in a memory; and a channel area to generate data signals based on the data items stored in the memory. When the crack occurs in the panel, the crack detector may set the source, the data processor, the memory, and the channel are to be in off states. The sensing line may be at an edge of the panel.

In accordance with one or more other embodiments, a method for inspecting a display device including a mobile industry processor interface (MIPI), the method comprising: supplying a predetermined voltage from a first integrated circuit in a data driver to a second integrated circuit in the data driver via a sensing line in a panel; determining, by the second integrated circuit, a level of the predetermined voltage; and turning off integrated circuits in the data driver when the voltage level is lower than a predetermined voltage level, wherein the first and second integrated circuits transmit and receive information corresponding to crack of the panel using a transmission terminal and a reception terminal in the MIPI.

When the voltage level is lower than the predetermined voltage level, the method may include generating, by the second integrated circuit, an error signal. The error signal may be sequentially supplied to the second integrated circuit through the first integrated circuit.

The method may include generating a reset signal, by the first integrated circuit, corresponding to the error signal. The method may include sequentially supplying the reset signal to the first and second integrated circuits. The reset signal may turn off the first and second integrated circuits.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

It will be understood that when an element is referred to as being "between" two elements, it can be the only element between the two elements, or one or more intervening elements may also be present. Like reference numerals refer to like elements throughout.

Figure 1:
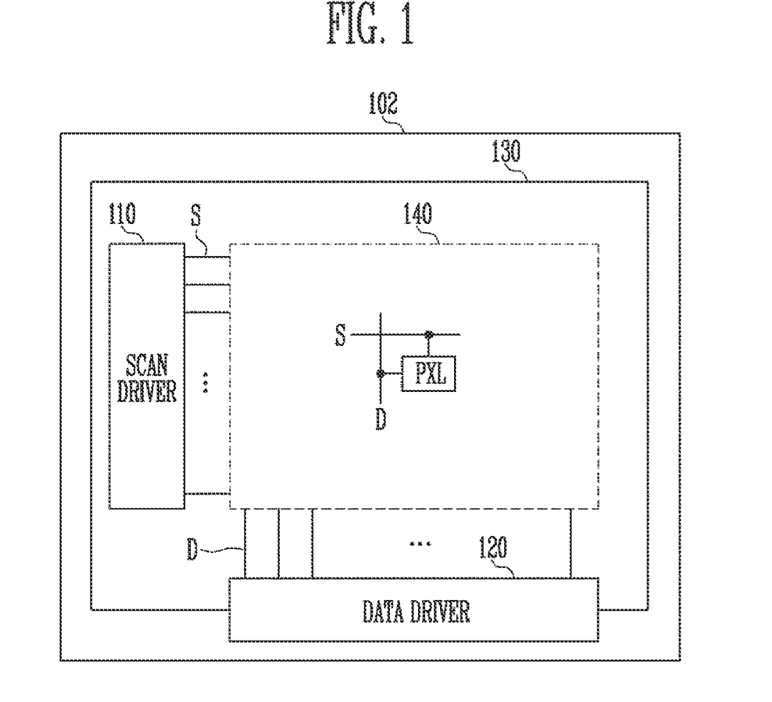
FIG. 1 illustrates an embodiment of a display device.

FIG. 1 illustrates an embodiment of a display device which includes a panel 102, a scan driver 110, a data driver 120, a sensing line 130, and a pixel unit 140. The pixel unit 140 includes pixels PXL connected to data lines D and scan lines S. Each pixel PXL emits light with a predetermined brightness based on data signals.

When the display device is an organic light emitting display device, each pixel PXL includes a plurality of transistors (including a driving transistor) and an organic light emitting diode (OLED). The pixels PXL are selected when scan signals are supplied to the scan lines S and emit light based on the data signals from the data lines D. The driving transistors in the pixels PXL supply currents to OLEDs based on data signals, and the OLEDs emit light components with predetermined brightness components based on the data signals.

When the display device is a liquid crystal display device, each pixel PXL includes a switching transistor and a liquid crystal capacitor. The pixels PXL are selected when the scan signals are supplied to the scan lines S and receive the data signals from the data lines D. Then, the pixels PXL control transmittance of liquid crystal based on the data signals, so that light components with predetermined brightness components are emitted.

The scan driver 110 supplies the scan signals to the scan lines S. For example, the scan driver 110 may sequentially supply the scan signals to the scan lines S. The pixels PXL may be selected in units of horizontal lines.

The data driver 120 supplies the data signals to the data lines D. For example, the data driver 120 may supply the data signals to the data lines D in synchronization with the scan signals. Then, the data signals are supplied to the pixels PXL selected by the scan signals. The data driver 120 is connected to pads to receive various voltages and/or signals including data. The data driver 120 includes a plurality of integrated circuits mounted in the panel 102.

At least one sensing line 130 is formed as a wiring line for detecting crack of the panel 102. The sensing line 130 may be formed, for example, at an edge of the panel 102 to allow for crack detection. Ends of the sensing line 130 are electrically connected to the data driver 120. For example, the sensing line 130 may be connected from one side of the data driver 120 to another side of the data driver 120, via the edge of the panel 102, so that the sensing line 130 has predetermined capacitance and resistance. Therefore, when a crack occurs in panel 102, the resistance of sensing line 130 changes.

For example, when a crack occurs in the panel 102, the crack is generated in metal that forms the sensing line 130. When the crack is generated in the sensing line 130, resistance of the sensing line 130 increases. Thus, according to one embodiment, a crack in the panel 102 is detected based on a change in resistance of the sensing line 130. In addition, the sensing line 130 may be formed using at least one of the metals used in a process for forming the panel 102.

Figure 2:
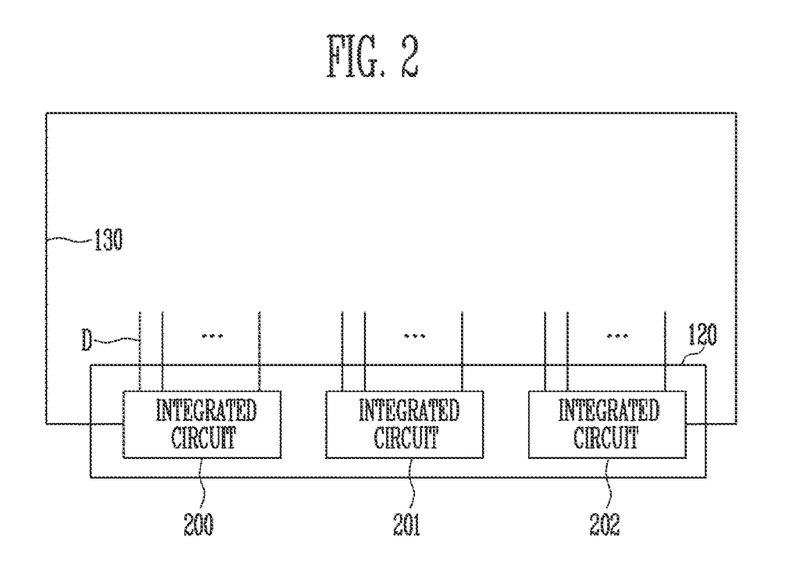
FIG. 2 illustrates an embodiment of a data driver.

FIG. 2 illustrates an embodiment of the data driver 120 which includes at least two integrated circuits. In the example of FIG. 2, three integrated circuits 200, 201, and 202 are illustrated that supply data signals to data lines D connected thereto.

Each of the integrated circuits 200, 201, and 202 includes a predetermined number of channels. For example, each of the integrated circuits 200, 201, and 202 may have a uniform number of channels, e.g., 384 or 480. Since each of the integrated circuits 200, 201, and 202 has a uniform number of channels, the number of integrated circuits 200, 201, and 202 in data driver 120 increases in accordance with an increase in resolution of the panel 102.

When a crack occurs in the panel 102, the integrated circuits 200, 201, and 202 may be simultaneously reset. For example, when a crack occurs in the panel 102, an image with desired brightness is not displayed by the pixel unit 140. In this case, an overcurrent (or overvoltage) may be supplied from the integrated circuits 200, 201, and 202 to the panel 102 so that the image with the desired brightness is displayed by the pixel unit 140. Therefore, a fire may break out in the panel 102. In order to prevent fire from breaking out in the panel 102, according to the embodiment, the integrated circuits 200, 201, and 202 are simultaneously reset when a crack occurs in the panel 102.

In order to reduce or minimize dead space of the panel 102, various elements including an element for supplying the data signals may be included in the integrated circuits 200, 201, and 202.

Figure 3:
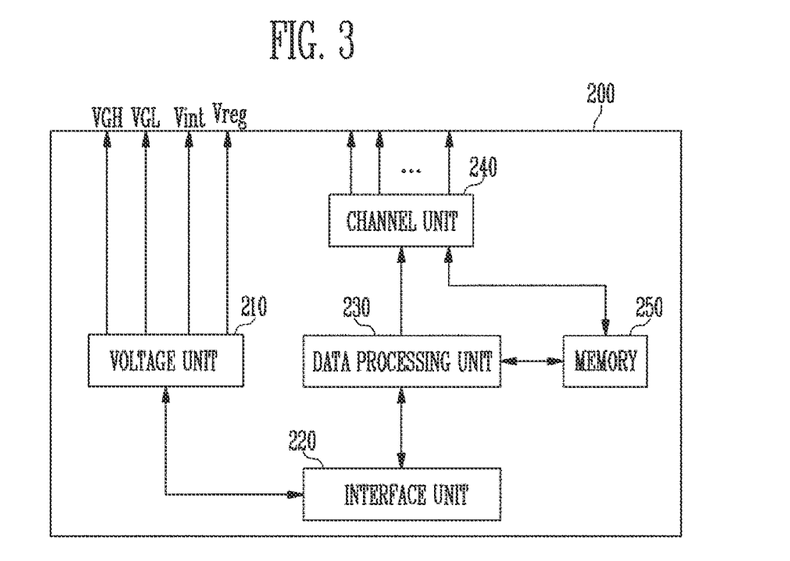
FIG. 3 illustrates an embodiment of an integrated circuit.

FIG. 3 illustrates an embodiment of an integrated circuit representative of the integrated circuits in FIG. 2. The integrated circuit 200 in FIG. 3 includes a voltage unit 210, interface unit 220, data processing unit 230, channel unit 240, and a memory 250.

The voltage unit 210 generates voltages for driving the panel 102. For example, the voltage unit 210 may supply a gate high voltage VGH and a gate low voltage VGL to the scan driver 110. In addition, the voltage unit 210 may generate a gamma reference voltage Vreg for generating gamma voltages and an initializing voltage Vint for initializing the pixels PXL. Thus, the voltage unit 210 generates various voltages for driving the panel 102.

The interface unit 220 receives various signals and data from an external system. When the panel 102 is in a portable device, the interface unit 220 may include a mobile industry processor interface (MIPI). The MIPI is an interface with low power consumption, a high transmission speed, and high expandability, and thus may be used for the portable device.

The data processing unit 230 rearranges the data supplied via the interface unit 220 in accordance with the resolution of the panel 102, and stores the rearranged data in the memory 250. The data processing unit 230 processes the data stored in the memory 250 using, for example, a picture quality improving algorithm and a command (for example, brightness control) supplied via the interface unit 220.

The memory 250 stores the data and may be a random access memory (RAM) or another type of memory.

The channel unit 240 receives the data stored in the memory 250 and generates data signals based on control of the data processing unit 230. For example, the channel unit 240 may select one of a plurality of gamma voltages as a data signal based on a data bit. The data signals generated by the channel unit 240 are supplied to data lines D.

Figure 4:
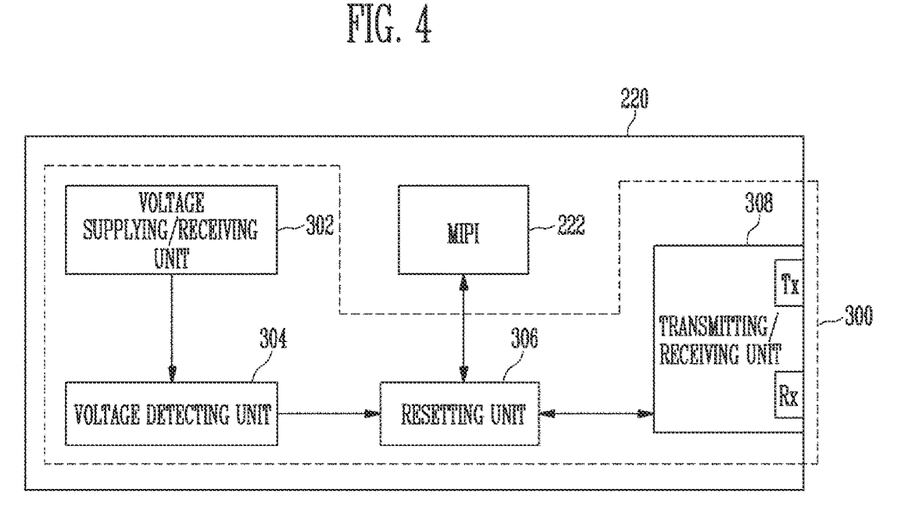
FIG. 4 illustrates an embodiment of an interface unit.

FIG. 4 illustrates an embodiment of the interface unit 220 of FIG. 3 which includes an MIPI 222 and a crack detecting unit 300. The MIPI 222 is an interface which receives various signals and data from an external system. The MIPI 222 has a standardized specification.

The crack detecting unit 300 transmits and receives information corresponding to the crack to and from adjacent integrated circuits using a transmission terminal Tx and a reception terminal Rx in the specification of the MIPI 222.

The crack detecting unit 300 includes a voltage supplying/receiving unit 302, a voltage detecting unit 304, a resetting unit 306, and a transmitting/receiving unit 308. The voltage supplying/receiving unit 302 supplies or receives a predetermined voltage. For example, the voltage supplying/receiving unit 302 supplies a predetermined voltage to the sensing line 130 or receives the voltage supplied from the sensing line 130.

The voltage supplying/receiving unit 302 in the first integrated circuit 200 of FIG. 2 may supply the predetermined voltage to the sensing line 130. Then, the voltage supplying/receiving unit 302 in the third integrated circuit 202 of FIG. 2 may receive the predetermined voltage from the sensing line 130. The voltage supplying/receiving unit 302 in the second integrated circuit 202 not connected to the sensing line 130 does not perform an operation at this time.

The voltage detecting unit 304 receives the voltage received by the voltage supplying/receiving unit 302 and detects the level of the voltage. When the voltage has a level lower than a predetermined level, the voltage detecting unit 304 supplies a detection signal to the resetting unit 306. For example, when a crack occurs in the panel 102, the resistance of the sensing line 130 increases. When the resistance of the sensing line 130 increases, the voltage received by the voltage detecting unit 304 has a level lower than a predetermined level. In this case, the voltage detecting unit 304 supplies the detection signal to the resetting unit 306.

The resetting unit 306 controls an entire operation of the crack detecting unit 300. For example, when the detection signal is supplied from the voltage detecting unit 304, the resetting unit 306 supplies an error signal to an adjacent integrated circuit by using the transmitting/receiving unit 308. The error signal may be a signal indicative of the crack of the panel 102.

When the error signal is received by the transmitting/receiving unit 308, the resetting unit 306 may supply the error signal and/or a reset signal to the adjacent integrated circuit using the transmitting/receiving unit 308. The reset signal may be a signal corresponding to an off state of the integrated circuit.

When the reset signal is received from the transmitting/receiving unit 308, the resetting unit 306 sets the integrated circuit (one of 200, 201, or 202) that includes the resetting unit 306 to an off state. In one embodiment, the resetting unit 306 that receives the reset signal may control the voltage unit 210, the data processing unit 230, the channel unit 240, and the memory 250 to be in off states.

The transmitting/receiving unit 308 receives the error signal and/or the reset signal from the adjacent integrated circuit or transmits the error signal and/or the reset signal to the adjacent integrated circuit. For this purpose, the transmitting/receiving unit 308 may include the transmission terminal Tx and the reception terminal Rx. The transmission terminal Tx and the reception terminal Rx may be terminals included by the specification of the MIPI 222. When the transmission terminal Tx and the reception terminal Rx of the transmitting/receiving unit 308 correspond to the specification of the MIPI 222, an additional terminal is not included in the integrated circuits 200, 201, and 202 in order to transmit/receive crack information of the panel 102. The omission of this additional terminal allows for a reduction in manufacturing costs and dead space.

The reset signal and the error signal may be previously allotted to predetermined data in accordance with the specification of the MIPI 222. For example, "000001" is set as the reset signal and "100001" may be set as the error signal. When the reset signal and the error signal are transmitted/received by using the MIPI 222, a driving speed increases so that the crack of the panel 102 may be detected within a short time.

In FIG. 4, the voltage supplying/receiving unit 302, the voltage detecting unit 304, the resetting unit 306, and/or the transmitting/receiving unit 308 are outside the MIPI 222. In one embodiment, the voltage supplying/receiving unit 302, the voltage detecting unit 304, the resetting unit 306, and/or the transmitting/receiving unit 308 may be in the MIPI 222.

Figure 5:
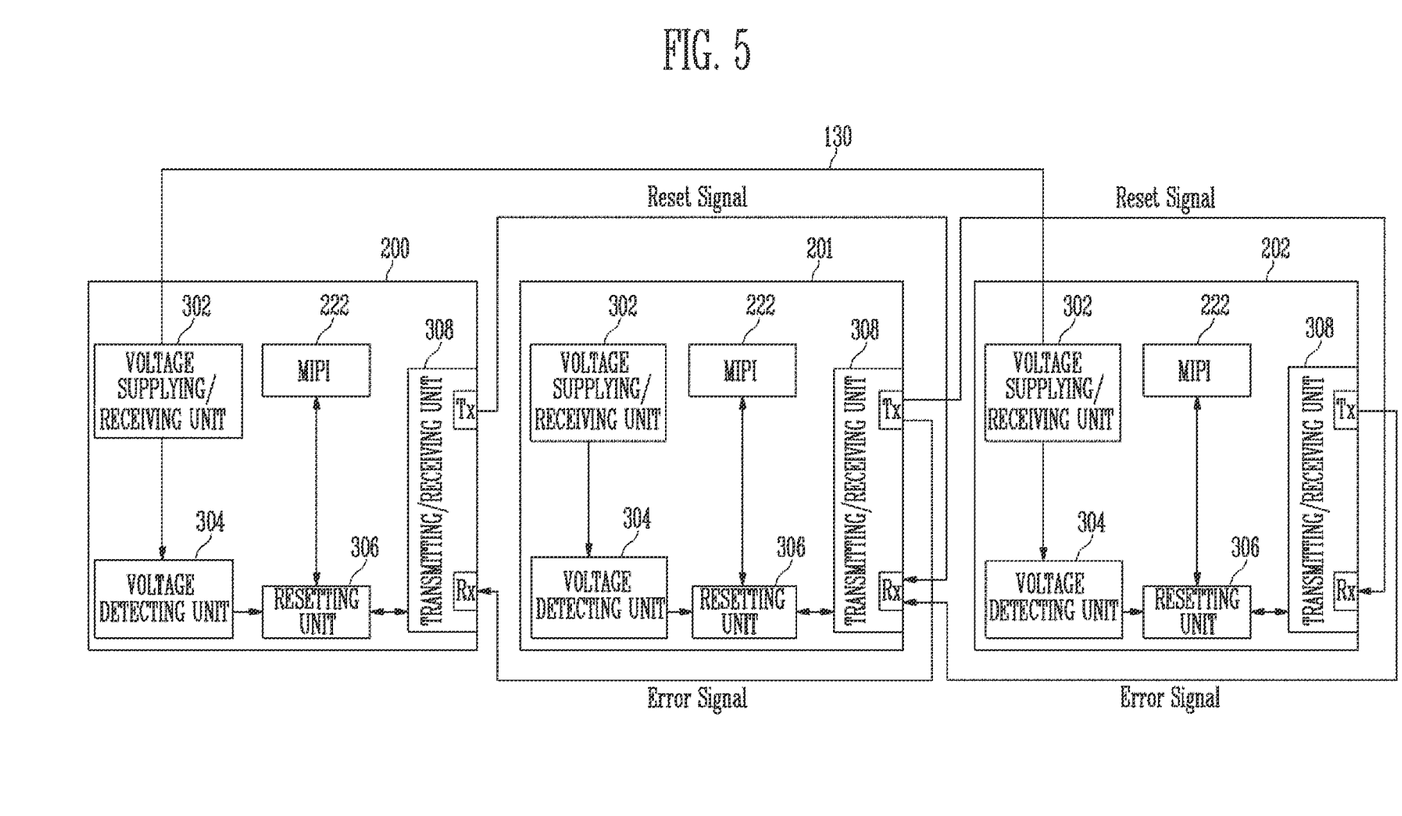
FIG. 5 illustrates an embodiment of a panel crack detecting process and an integrated circuit resetting process.
Figure 6:
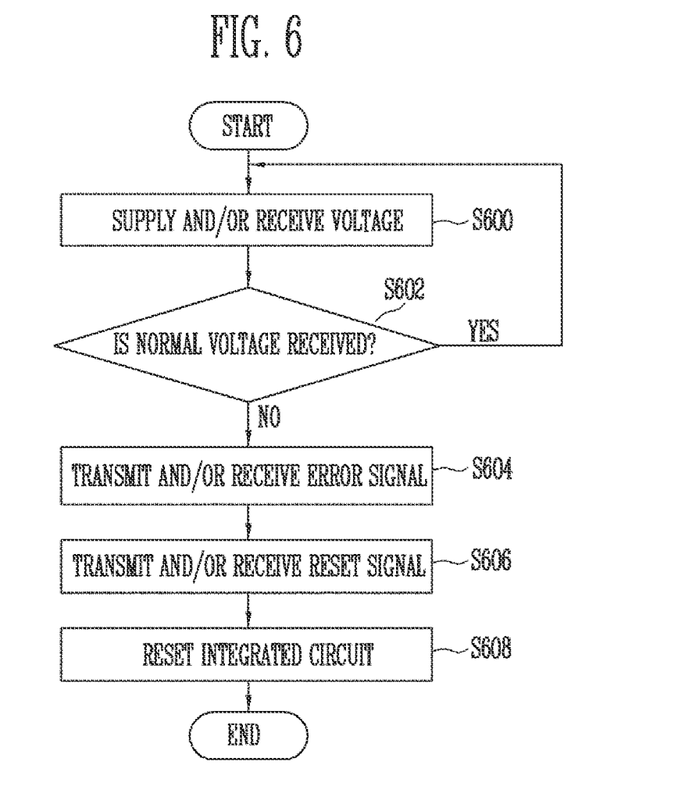
FIG. 6 illustrates an embodiment of a method for inspecting a display panel.

FIG. 5 illustrates an embodiment of a process for detecting a panel crack and a process for resetting an integrated circuit. FIG. 6 illustrates an embodiment of a method for inspecting a panel of a display device. The elements in the first integrated circuit 200 will be referred to as "first elements," the elements in the second integrated circuit 201 will be referred to as "second elements," and the elements in the third integrated circuit 202 will be referred to as "third elements."

Supply and/or Receive the Voltage: Operation S600

First, the first voltage supplying/receiving unit 302 in the first integrated circuit 200 supplies the predetermined voltage to the sensing line 130. The predetermined voltage from the first voltage supplying/receiving unit 302 is supplied to the third voltage supplying/receiving unit 302 in the third integrated circuit 202 via the sensing line 130.

Determine Whether a Normal Voltage is Received: Operation S602

The third voltage detecting unit 304 in the third integrated circuit 202 determines whether the voltage received by the third voltage supplying/receiving unit 302 is a normal voltage. For example, when the voltage received by the third voltage supplying/receiving unit 302 has a level no less than a predetermined level, the third voltage detecting unit 304 determines that the voltage is the normal voltage. When it is determined by the third voltage detecting unit 304 that the voltage received by the third voltage supplying/receiving unit 302 is the normal voltage, operations S600 and S602 are repeated. Thus, when a crack is not generated in the panel 102, operations S600 and S602 are repeated.

When the voltage received by the third voltage supplying/receiving unit 302 has a level lower than the predetermined level, the third voltage detecting unit 304 determines that the voltage is not the normal voltage. In this case, the third voltage detecting unit 304 supplies the detection signal to the third resetting unit 306 in the third integrated circuit 202.

Transmit and/or Receive the Error Signal: Operation S604

The third resetting unit 306 that receives the detection signal supplies the error signal to the second transmitting/receiving unit 308 in the second integrated circuit 201 using the third transmitting/receiving unit 308. At this time, the second resetting unit 306 in the second integrated circuit 201 supplies the error signal to the first transmitting/receiving unit 308 in the first integrated circuit 200 using the second transmitting/receiving unit 308.

Transmit and/or Receive the Reset Signal: Operation S606

When the error signal is received by the first transmitting/receiving unit 308, the first resetting unit 306 in the first integrated circuit generates the reset signal. The first resetting unit 306 that generates the reset signal supplies the reset signal to the second transmitting/receiving unit 308 using the first transmitting/receiving unit 308. The reset signal supplied to the second transmitting/receiving unit 308 is supplied to the second resetting unit 306. The second resetting unit 306 that receives the reset signal supplies the reset signal to the third transmitting/receiving unit 308 using the second transmitting/receiving unit 308.

Reset the Integrated Circuit: Operation S608

The first resetting unit 306 that generates the reset signal and the second resetting unit 306 and the third resetting unit 306 that receive the reset signal turn off the voltage unit 210, the data processing unit 230, the channel unit 240, and the memory 250 that are in each of the integrated circuits 200, 201, and 202. Thus, the first through third resetting units 306 set the integrated circuits 200, 201, and 202 in which the first through third resetting units 306 are respectively to be in off states.

When the integrated circuits 200, 201, and 202 are in off states, power sources and the data signals are not supplied to the panel 102. Thus, when a crack occurs in the panel 102, the power sources and data signals for driving the panel 102 are not supplied. As a result, driving stability may be secured.

In accordance with one or more of the aforementioned embodiments, a data driver includes a plurality of integrated circuits. A first integrated circuit supplies a predetermined voltage to another integrated circuit via a sensing line. The other integrated circuit detects the level of a voltage from the sensing line and determines whether a crack occurs in a panel based on the detected level.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The drivers, processors, units, interfaces areas, and other signal generating and processing features of the disclosed embodiments may be implemented in logic which, for example, may include hardware, software, or both. When implemented at least partially in hardware, the drivers, processors, units, interfaces areas, and other signal generating and processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the drivers, processors, units, interfaces areas, and other signal generating and processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, when a determination is made that a crack has occurred in the panel, an error signal from the other integrated circuit is sequentially supplied to the first integrated circuit and/or another integrated circuit. Then, a reset signal corresponding to the error signal is sequentially supplied to the first integrated circuit and one or more other integrated circuits. The integrated circuits that receive the reset signal are set to off states to secure driving stability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display device, comprising:
   a substrate;
   pixels on the substrate;
   data lines electrically connected to the pixels and arranged in a first direction;
   a first integrated circuit electrically connected to the data lines;
   a second integrated circuit electrically connected to the data lines;
   a third integrated circuit electrically connected to the data lines; and a sensing line on the substrate and connected to the first integrated circuit and to the third integrated circuit, wherein the first integrated circuit, the second integrated circuit, and the third integrated circuit are arranged in the first direction, wherein the third integrated circuit is to supply a sensing signal to the first integrated circuit through the sensing line, and wherein, in response to receiving the sensing signal through the sensing line, the first integrated circuit is to apply a signal related to the sensing signal to the second integrated circuit.

2. The display device of claim 1,
wherein a first end of the sensing line is connected to the first integrated circuit and a second end of the sensing line is connected to the third integrated circuit.

3. The display device of claim 2,
wherein each of the first integrated circuit, the second integrated circuit, and the third integrated circuit comprises a mobile industry processor interface (MIPI).

4. The display device of claim 2,
wherein the second integrated circuit is located between the first integrated circuit and the third integrated circuit.

5. The display device of claim 4, further comprising:
a fourth integrated circuit electrically connected to the data lines,
wherein the fourth integrated circuit is located between the second integrated circuit and the third integrated circuit.

6. The display device of claim 1,
wherein the sensing line surrounds the pixels.

7. The display device of claim 1,
wherein the signal related to the sensing signal is an error signal.

8. The display device of claim 7,
wherein the first integrated circuit applies the error signal to the second integrated circuit when the sensing signal is at a level different from a predetermined level.

9. The display device of claim 8,
wherein the first integrated circuit receives a reset signal from the second integrated circuit after applying the error signal.

10. The display device of claim 9,
wherein the first integrated circuit and the second integrated circuit are configured to be in off states when the first integrated circuit receives the reset signal.

11. A display device, comprising:
a substrate;
pixels on the substrate;
data lines electrically connected to the pixels;
a first integrated circuit electrically connected to the data lines and comprising a first crack detector;
a second integrated circuit electrically connected to the data lines and comprising a second crack detector;
a third integrated circuit electrically connected to the data lines; and
a sensing line on the substrate and connected to the first integrated circuit,
wherein, in response to information received through the sensing line, the first integrated circuit is to apply a signal related to the information to the second integrated circuit, and
wherein a first end of the sensing line is connected to the first integrated circuit and a second end of the sensing line is connected to the third integrated circuit.

12. The display device of claim 11,
wherein the first integrated circuit is connected to first data lines from among the data lines,
wherein the second integrated circuit is connected to second data lines from among the data lines, and
wherein the third integrated circuit is connected to third data lines from among the data lines and comprises a third crack detector.

13. The display device of claim 12,
wherein the sensing line is not connected to the second integrated circuit.

14. The display device of claim 13,
wherein the first end of the sensing line is connected to the first crack detector,
wherein the second end of the sensing line is connected to the third crack detector, and
wherein the second crack detector is connected to at least one of the first crack detector and or the third crack detector.

15. The display device of claim 14,
wherein the first crack detector comprises a first transmission terminal and a first reception terminal,
wherein the second crack detector comprises a second transmission terminal connected to the first reception terminal and a second reception terminal connected to the first transmission terminal, and
wherein the third crack detector comprises a third transmission terminal connected to the second reception terminal and a third reception terminal connected to the second transmission terminal.

16. The display device of claim 15,
wherein the first transmission terminal is not connected to the third reception terminal, and
wherein the first reception terminal is not connected to the third transmission terminal.

17. The display device of claim 14,
wherein the third crack detector comprises a voltage supplying unit connected to the second end of the sensing line, and
wherein the first crack detector comprises a voltage receiving unit connected to the first end of the sensing line.

18. The display device of claim 17,
wherein the voltage supplying unit of the third crack detector is configured to supply a sensing signal to the sensing line,
wherein the voltage receiving unit of the first crack detector is configured to receive the sensing signal via the sensing line,
wherein the first crack detector is configured to transmit a first error signal to the second crack detector when the first crack detector determines that the sensing signal is at a level different from a predetermined level, and
wherein the second crack detector is configured to transmit a second error signal to the third crack detector when the second crack detector receives the first error signal.

19. The display device of claim 18,
wherein the third crack detector is configured to transmit a first reset signal to the second crack detector when the third crack detector receives the second error signal, and
wherein the second crack detector is configured to transmit a second reset signal to the first crack detector when the second crack detector receives the first reset signal.

20. The display device of claim 19,
wherein the first integrated circuit, the second integrated circuit, and the third integrated circuit are configured to be in off states when the first reset signal and the second reset signal are generated.

\* \* \* \* \*

UNITED STATES PATENT AND TRADEMARK OFFICE
CERTIFICATE OF CORRECTION

PATENT NO. : 11,980,085 B2
APPLICATION NO. : 17/378599
DATED : May 7, 2024
INVENTOR(S) : Ho Seok Han It is certified that error appears in the above-identified patent and that said Letters Patent is hereby corrected as shown below:

In the Claims

In Column 10, Line 19, in Claim 14, delete "and or" and insert -- and/or --.

Signed and Sealed this
Twenty-ninth Day of October, 2024

Katherine Kelly Vidal
Director of the United States Patent and Trademark Office